United States Patent [19]
De-Kai

[11] Patent Number: 4,916,427
[45] Date of Patent: Apr. 10, 1990

[54] ELECTRONIC ELECTROTHERMAL CONVERSION MATERIAL, ITS PRODUCTS AND METHOD FOR PRODUCTION THEREOF

[76] Inventor: Kong De-Kai, No. 71 Mian Hua Lane, Wu Xi, Jiang Su, China

[21] Appl. No.: 287,110

[22] Filed: Dec. 20, 1988

[30] Foreign Application Priority Data

Jun. 1, 1988 [TW] Taiwan ................................ 88100015

[51] Int. Cl.$^4$ .............................................. H01C 7/10
[52] U.S. Cl. ..................................... 338/22 R; 29/612; 219/543; 338/225 D
[58] Field of Search ................. 338/225 D, 22 R, 302; 219/543, 542; 29/611, 612

[56] References Cited

U.S. PATENT DOCUMENTS 4,104,507  8/1978  Tinsone et al. .................... 338/22 R
4,499,334  2/1985  Merritt et al. .................... 338/302 X

FOREIGN PATENT DOCUMENTS 2085699  4/1982  United Kingdom .
2085700  4/1982  United Kingdom .

Primary Examiner—B. A. Reynolds
Assistant Examiner—M. Lateef
Attorney, Agent, or Firm—Felfe & Lynch

[57] ABSTRACT

The present invention relates to the field of electro-thermal conversion material and its products, made by semiconductor material. The process of making the electrothermal conversion material is as follows: a liquor is composed by dissolving two kinds of chloride (tin tetrachloride, etc.) in ethyl alcohol or carbinol, and another liquor, ammonium fluoride. After atomization of these two liquors, under the condition of high temperature, high valent metal oxide, low valent metal oxide and metal single substance etc, the metals of which correspond to the two kinds of chloride, deposit onto the surface of the high-temperature-resistant insulating material, forming a conductive semiconductor membrane.

14 Claims, 4 Drawing Sheets

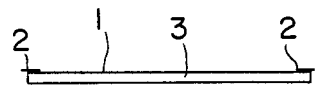
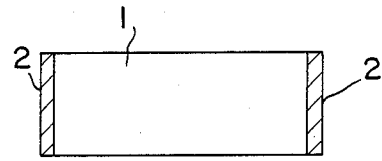
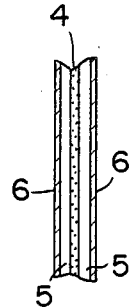
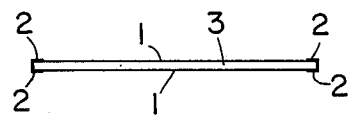
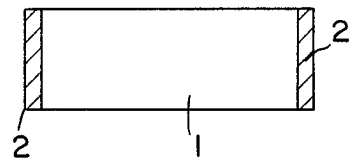

ELECTRONIC ELECTROTHERMAL CONVERSION MATERIAL, ITS PRODUCTS AND METHOD FOR PRODUCTION THEREOF

TECHNICAL FIELD

The present invention relates to the field of electro-thermal conversion material made from semiconductor material, and its products.

BACKGROUND OF THE INVENTION

The semiconductor electrothermal conversion material nowadays used, i.e, material PTC, is sintered by a compound of barium titanate series, its shortcomings are: poor heat-conductance, a lower ability to withstand electric voltage, brittleness, complication in manufacture, high cost, acute current variation in use (may be up to $10^5$), strict limitation in temperature-rise (about 300° C. or so) due to the restriction by the lower Curie temperature of the PTC material.

The object of this invention is to avoid the shortcoming of the prementioned prior art and to provide an electronic electrothermal conversion material, its products and the method for production thereof, which are cheaper, easier to produce, highly efficient in electrothermal conversion, fast in raising its temperature, possible to heat without open fire in a certain range of temperatures, lower thermal inertia, corrosion-resistant and durable in service.

SUMMARY OF THE INVENTION

According to this invention the method for the production of the electronic electrothermal conversion material and its products comprises following steps:

(a) dissolve two kinds of chlorides, i.e. tin tetrachloride and any one of the followings: antimony trichloride, lead chloride, zinc chloride or indium chloride, into one of the following organic liquors: ethyl alchohol, carbinol and acetone;

(b) use any one of the aqueous solutions of ammonium fluoride, hydrofluoric acid and tartaric acid as a reducing agent;

(c) make the high-temperature-resistant insulating material rinsed and dewatered, then put it into a container, the temperature of which should be 350°–550° C., and let the insulating material reach the same temperature as that of the container;

(d) put the atomized organic solution with two kinds of chlorides dissolved, and the atomized solution used as a reducing agent into the container holding said high-temperature-resistant insulating material to produce fluoric moleculae as well as high valent metal oxide, low valent metal oxide and metal single substances, the metals of which correspond to the metals of the above mentioned two kinds of chloride; these substances precipitate onto the high-temperature-resistant insulating material to form a conductive semiconductor membrance;

(e) connect the electrodes from the said conductive semiconductor membrane outward to a power sourece.

According to this invention the electronic electrothermal conversion material and its products consist of power supply electrodes, high-temperature-resistant insulating material, and conductive semiconductor membrane precipitated on the surface of the said material, the said conductive semiconductor membrane is made of fluoric moleculae as well as high valent metal oxide, low valent metal oxide and metal single substances, the metals of which correspond to said two kinds of chlorides, the first of which is tin tetrachloride and the second is any one of the followings: antimony trichloride, lead chloride, zinc chloride and indium chloride.

DESCRIPTION OF DRAWINGS OF THIS INVENTION

FIGS. 1A and 1B show one kind of electronic electro-heating material;

FIG. 2 shows the sectional view of a defroster or drying apparatus made of electronic electrothermal conversion material;

FIG. 3A and 3B show two layered electronic electro-heating material;

DETAILED DESCRIPTION OF THE INVENTION

Figure 4:
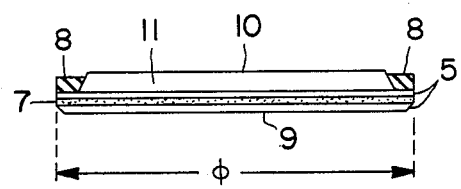
FIG. 4 shows an electric heating dish made of the material shown in FIGS. 3A and 3B.

The process of the electronic electrothermal conversion material and its products according to this invention is as follows: two kinds of chloride, one is tin tetrachloride and another is any one of following: antimony trichloride, lead chloride, zinc chloride, indium chloride, are separately dissolved in the absolute ethyl alcohol or carbinol or acetone, then mixing them (to be called as solution A), the distilled aqueous solution of ammonium fluoride or hydrofluoric acid or tartaric acid is used as reducing agent (to be called as solution B). After being rinsed (acid-etch cleaning or alkaline cleaning), water scrubbed and de-ionized water scrubbed and fully dewatered, the high-temperature-resistant insulating material is put into a container with 350°–550° C. in which there is no open fire (this container is used as depositing chamber) and let it reach the same temperature as that of the container; the said solutions A and B, atomized uniformly by high pressure air, are put into depositing chamber, they can simultaneously be put into it, or at first the solution A then the solution B are put into the chamber, solution A reacts with water to produce gas of hydrogen chloride and high valent metal oxide, the metals of which correspond to the two kinds of chlorides (if the chlorides in solution A are tin tetrachloride and antimony trichloride, tin dioxide and antimony dioxide will be produced), part of metal oxides reduce to low valent metal oxide and metal single substances under reaction of reducing agent (if tin tetrachloride and antimony trichloride are used, low valent metal oxide and metal single substances are tin monoxide, antimony monoxide and tin, antimony correspondingly), at the same time, fluoric moleculae is dissociated. These substantial particles deposit onto superficial layer of high-temperature-resistant insulating material (Term "deposition" means the process that the substantial particles deposit gradually on to surface of certain body under specified temperature), and a conductive semiconductor membrance will be formed. Owing to the treatment of rinsing and dewatering the high-temperature-resistant insulating material, the absorption affinity of the surface of the material is very strong, the association between the conductive layer and the superficial layer of the insulating material is firm. Such conductive semiconductor membrance contains uncomplete metal oxides and fluoric moleculae, after aging treatment, a stable structure is formed, therefore, when it works in the environment of dissipating heat timely, the output power is stable, once the temperature reduces to room temperature, its resistance is recoverable within an allowable range.

Owing to existance of high and low valent metal oxides and metal single substances simultaneously in the electronic electro-heating material, the temperature rises rapidly, the highest temperature may reach 900° C., the optimum working temperature is 300° C. or so, if it works up to 500° C., there will be no open fire. The higher the concentration of low valent metal oxides and metal single substances is, the faster will be the speed of elcctrothermal conversion, the stronger the high-temperature-resistant ability, the worse the transparency of the depositing layer (conductive membrance), but on the contrary, the better the transparency.

Owing to being of no open fire at the working time of such electronic electro-heating material, the form of superimposing multiple layer of electronic electro-heating material can be used to obtain large power electronic electro-heating material. The large power means that the temperature can be raised rapidly and the service life prolonged under condition of larger average power. As the service life is inversely proportional to the average power per unit area, the large power electronic electro-heating material obtained by superimposition possesses larger power for superimposed body but takes less part of power for every layer, so it can realize rapid rise of temperature and long service life.

Now further detailed description for the electronic electro-heating material and its products according to this invention will be made with reference to the drawings.

FIGS. 1A and 1B show shows an electronic electro-heating material, wherein 1—depositing layer (conductive membrance), 2—the silver oar electrodes, 3—the insulating slice, the chemical component of which is $Al_2O_3$ or $KMg(AlSi_3O_{10})F_2$. 2 is connected to a power source. Such super thin electronic electro-heating material can be used to make products of a high efficiency defroster, heating dish, dry apparatus, iron, electroheating demister etc.

FIG. 2 shows the sectional view of defroster or drying apparatus, wherein 4—the electronic electro-heating material shown in FIG. 1, 5—the insulating slice, 6—metallic case. A uniform thermal field is formed around the surface of "6" at working time, it can uniformly defrost or dry clothing, and can be used as a heat source plate of heating equipment.

FIGS. 3A and 3B show shows the electronic electro-heating material, both surfaces of which possess conductive membrance, wherein 1 is depositing face (conductive membrance), 2 are electrodes, 3 is a slice of insulating material.

FIG. 4 shows the sectional view of a heating dish made of the electro-heating material shown in FIGS. 3A and 3B, wherein 5 are the insulating slices, 7 is the large power slice shown in FIG. 3, 8 is the sealing filler (e.g. epoxy resin), 9,10 are the circular metallic cases separately, 11 is the air band. When 7 works with its two surfaces, the surface of 9 transfers heat and serves as a working area, the temperature of the surface of 10 is lower than that of the surface of 9 due to the separation of the air band 11.

Figure 5:
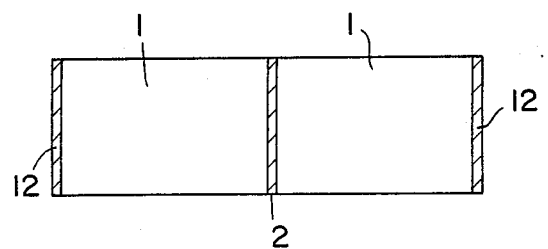
FIG. 5 shows electronic electro-heating material made from $KMg(AlSi_3O_{10})F_2$ material.
Figure 6:
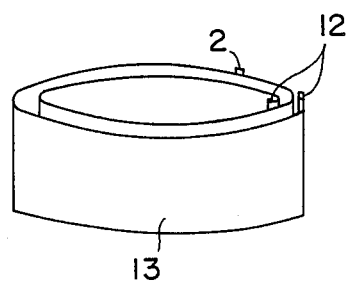
FIG. 6 shows a sleeve electro-heating element made of the material shown in FIG. 5.

FIG. 5 shows large power electronic electro-heating body made by insulating material, the chemical component of which is $KMg(AlSi_3O_{10})F_2$ and its thickness is 0.1 mm. In the figure, 2 and 12 are the electrodes, 1 is the depositing area. The electrodes 2 and 12 are connected to the power source separately, FIG. 6 shows a sleeve shape large power electro-heating element, wherein 2 and 12 are the electrodes (a thin and long silver oar is connected with metallic slice outward), 13 is the electronic electro heating material shown is FIG. 5. Such material is rolled up to form large power electro-heating coil, it can be used to heat or dewax the oil delivery pipe, or can be used to heat various kinds of conduits.

Figure 7:
FIG. 7 shows multilayered superimposed electronic electro-heating material.

FIG. 7 shows a sectional view of superimposed large power electronic electro-heating material, wherein 14—metallic plate, 15—enamel layer, 1 is depositing surface. 1 is connected with trapezoidal silver oar electrodes. Such large power electronic electro-heating material can be used as a glazing apparatus, or as an electro-heating surface for food treatment, etc. The process for producing this material is as follows: The high-temperature-resistant insulating material is coated on a metal plate, e.g. enamel, then is formed by means of sintering, after deposition treatment on it, the treatment of coating the high-temperature-resistant material and deposition are repeated once again, above procedures are repeated for several times to form the electronic electro-heating material finally.

Figure 8:
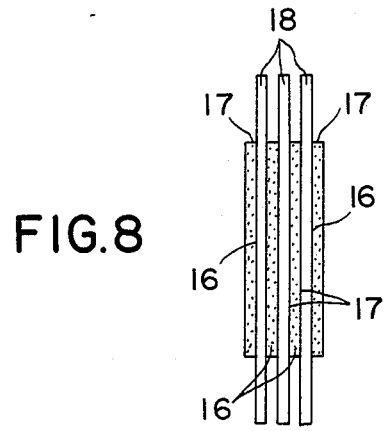
FIG. 8 shows electronic electro-heating material superimposed by mechanical method.

FIG. 8 shows a large power body superimposed by means of the mechanical method, wherein 16—the large power element shown in FIG. 3, 17—the insulating layer, 18—the metallic radiating plate. The temperature of this equipment rises rapidly, it can be used to heat a large amount of liquid or gas flow.

Figure 9:
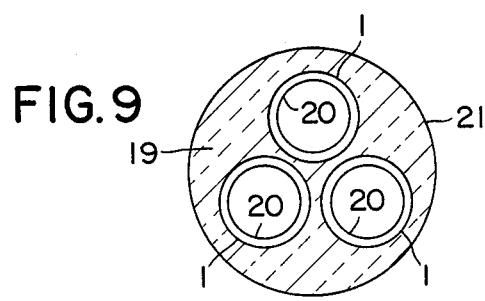
FIG. 9 shows the sectional view of the electronic electro-heating material made of honeycombed high-temperature-resistant insulating material.

FIG. 9 shows a sectional view of a high-power honeycombed body, wherein 1—the depositing layer, 20—the glass or porcelain tube, 21—the fixed case, 19—the insulating filler. While 1 is heating at work, the liquid passing through 20 is heated.

Figure 10:
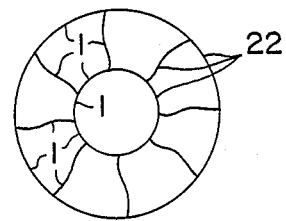
FIG. 10 shows the sectional view of another honeycombed electronic electro-heating material.

FIG. 10 shows another high-power honeycombed body, wherein 22—thin wall of the high-temperature-resistant insulating material, all the inner wall surface has been treated by deposition. This equipment is a cheap heater for a large amount of gas.

Figure 11:
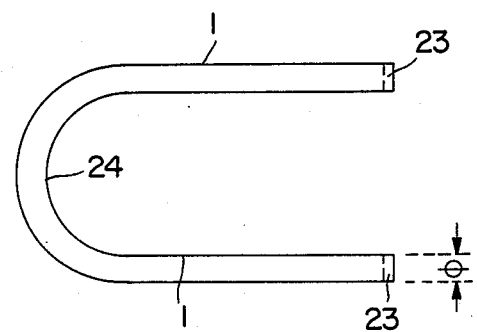
FIG. 11 shows the electronic electro-heating element made from U shape glass tube or porcelain tube as the high-temperature-resistant insulating material.

FIG. 11 shows a heating element made of glass or porcelain tube, wherein 1 is the depositing face, 24—the tube wall, 23—electrodes, which is sealed by insulating glue and lead out by conductors. Such an element can be immersed in the corrosive liquor (e.g. electroplating solution, caustic soda solution) to heat it.

Following are the advantages of this invention compared with prior art.

The material according to this invention can be used up to 500° C. without open fire and light, so it can be used as a heat source, where open fire is prohibited. As the auxiliary fire-proof material is no longer needed, the cost will be reduced.

The heat-inertia of the material according to this invention is small, so it can be used as the heat source in the thermal field of constant temperature where the difference in temperature desired is extremely small.

Owing to the corrosion-proof character the material according to this invention can be used as a heat source in the corrosive environment.

The material according to this invention has a long service life. Let us take the defroster of a refrigerator for example, the service life will be as long as 10,000 hours or so, the ability to resist the impulse voltage of 220 v may be 10 million times or so.

A large area heating element according to this invention can be manufactured in very thin form and the thermal field produced is uniform, so there is a wide field for its practical application.

According to this invention the technological temperature used in its manufacture is moderate, and the technological equipments are simple, so it is easy to produce, and the cost is low.

The material of dielectric slice KMg $(AlSi_3O_{10})F_2$ used in this invention is of low cost low. Consider the material of 0.2 mm thick for example, per $cm^2$ of this material costs only RMB 0.004 Yuen, it is a great superiority in competition. A thin high-power electrothermal conversion body can be formed by superimposing method according to this invention to gain both effects of large power and long service life.

The material according to this invention contains uncomplete oxide semiconductor, the speed of forming the charge carriers in electrical field is high, temperature of element rises rapidly, benefit of energy-saving is substantial, it is a unique, effective for energy-saving electrothermal conversion material. Particularly, with the electro-heating elements according to this invention the heat is conducted by dielectric substance instead of the air as a heat-transfer medium, so the thermal availability of the electric heating products is very high.

What is claimed is:

1. An electronic electrothermal conversion material and its products comprising power supply electrodes, high temperature-resistant insulating material and a conductive semiconductor membrane precipitated on a surface of said insulating material, said membrane being made of fluoric molecules as well as high valent metal oxide, low valent metal oxide and metal single substances, metals of which correspond to two kinds of chlorides, the first of which is tin tetrachloride and the second is one of the group consisting of antimony trichloride, lead chloride, zinc chloride and indium chloride.

2. The material and its products according to claim 1, wherein said high-temperature-resistant insulating material is selected from the group consisting of glass, quartz, graphite, mica, enamel and ceramic.

3. The material and its products according to claim 1, wherein said high-temperature-resistant insulating material has one of the following shapes: slice, arc and sleeve, and wherein said conductive semiconductor membranes are on both surfaces of said insulating material.

4. The material and its products according to claim 2, wherein said high-temperature-resistant insulating material has one of the following shapes: slice, arc and sleeve, and wherein said conductive semiconductor membranes are on both surfaces of said insulating material.

5. The material and its products according to claim 1, wherein said high-temperature-resistant insulating material is multilayered, and wherein said conductive semiconductor membrane is between these layers.

6. The material and its products according to claim 2, wherein the high-temperature-resistant insulating material is multilayered, and wherein said conductive semiconductor membrane is between these layers.

7. The material and its products according to claim 1, wherein said high-temperature-resistant insulating material is honeycombed, and wherein said conductive semiconductor membrane is on an inner surface of the material.

8. The material and its products according to claim 2, wherein said high-temperature-resistant insulating material is honeycombed, and wherein said conductive semiconductor membrane is on an inner surface of the material.

9. The and its products according to claim 1, wherein a chemical component of said high-temperature-resistant insulating material is one of the group consisting of KMg $(AlSi_3O_{10})F_2$ and $Al_2O_3$, and wherein said conductive semiconductor membrane is on the surface of the material.

10. A method for manufacturing electronic electrothermal conversion material and its products comprising:
    (a) dissolving two kinds of chloride, consisting of tin tetrachloride and one of the group consisting of antimony trichloride, lead chloride, zinc chloride and indium chloride, into one of the following organic liquors selected from the group consisting of ethyl alcohol, carbinol and acetone;
    (b) using any one of aqueous solutions selected from the group consisting of ammonium fluoride, hydrofluoric acid and tartaric acid as a reducing agent;
    (c) making high-temperature-resistant insulating material rinsed and dewatered, putting it into a container, the temperature of which is 350°–550° C., and allowing the insulating material to reach the same temperature as that of the container;
    (d) putting the atomized organic liquor with two kinds of chlorides dissolved and the atomized liquor used as reducing agent into the container holding said high-temperature-resistant insulating material to produce fluoric molecules as well as high valent metal oxide, low valent metal oxide and metal single substances, the metals of which correspond to the above mentioned two kinds of chlorides; precipitating these substances onto the high-temperature-resistant insulating material to form a conductive semiconductor membrane; and
    (e) connecting the electrodes from said conductive semiconductor membrane outward to a power source.

11. The method according to claim 10, wherein the said high-temperature-resistant insulating material is one of the group consisting of glass, quartz, graphite, mica, enamel and ceramic.

12. The method according to claim 10, wherein the chemical component of the said high-temperature-resistant insulating material is one of the group consisting of KMg$(AlSi_3O_{10})F_2$ and $Al_2O_3$.

13. The method as claimed in claim 10, wherein the step of putting said two kinds of liquors into the container includes at first putting the organic liquor with two kinds of chlorides dissolved into the container, then putting the liquor used as reducing agent into the container also.

14. The method as claimed in claim 10, wherein the step of putting said two kinds of liquors into the container comprises putting the organic liquor with two kinds of chloride dissolved and the liquor used as a reducing agent into the container simultaneously.

* * * * *

UNITED STATES PATENT AND TRADEMARK OFFICE
CERTIFICATE OF CORRECTION

PATENT NO. :
DATED      :  4,916,427
INVENTOR(S) :  April 10, 1990
              Kong De-Kai It is certified that error appears in the above-identified patent and that said Letters Patent is hereby corrected as shown below:

On the title page:

Under Heading [30] for "Taiwan" read

-- People's Republic of China --.

Under Heading [30] for "June 1, 1988" read

-- January 6, 1988 --.

Signed and Sealed this

Tenth Day of December, 1991

Attest:

HARRY F. MANBECK, JR.

*Attesting Officer*    *Commissioner of Patents and Trademarks*